(12) United States Patent
Belz et al.

(10) Patent No.: US 12,184,292 B2
(45) Date of Patent: Dec. 31, 2024

(54) SUB-SAMPLING PHASE LOCKED LOOP (SSPLL) WITH SATURATED REFERENCE FEEDBACK

(71) Applicant: THE REGENTS OF THE UNIVERSITY OF MICHIGAN, Ann Arbor, MI (US)

(72) Inventors: Matthew R. Belz, Columbus, OH (US); Lu Jie, Ann Arbor, MI (US); Seungheun Song, Ann Arbor, MI (US); Michael P. Flynn, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 18/355,146

(22) Filed: Jul. 19, 2023

(65) Prior Publication Data

US 2024/0030927 A1 Jan. 25, 2024

Related U.S. Application Data

(60) Provisional application No. 63/391,592, filed on Jul. 22, 2022.

(51) Int. Cl.
*H03L 7/091* (2006.01)
*H03K 19/173* (2006.01)
*H03L 7/093* (2006.01)

(52) U.S. Cl.
CPC ......... *H03L 7/091* (2013.01); *H03K 19/1737* (2013.01); *H03L 7/093* (2013.01)

(58) Field of Classification Search
CPC . H03L 7/091; H03L 7/093; H03L 7/08; H03L 7/085; H03L 7/087; H03L 7/0992; H03L 7/0993; H03K 19/1737; H03K 19/173; H03K 19/1733
See application file for complete search history.

(56) References Cited

U.S. PATENT DOCUMENTS

| | | | | |
|---|---|---|---|---|
| 5,192,915 A | * | 3/1993 | Mathieu | H03L 7/091 331/25 |
| 7,042,970 B1 | * | 5/2006 | Keaveney | H03L 7/1976 375/376 |
| 8,648,634 B2 | * | 2/2014 | Kelkar | H03L 7/093 327/148 |
| 8,779,812 B1 | * | 7/2014 | Kavanagh | H03L 7/095 327/156 |
| 8,903,031 B2 | * | 12/2014 | Werner | H04L 7/033 375/376 |
| 9,240,794 B2 | * | 1/2016 | Reichelt | H03L 7/099 |
| 9,515,668 B2 | * | 12/2016 | Faisal | H03L 7/103 |

(Continued)

Primary Examiner — James M Perez
(74) Attorney, Agent, or Firm — Harness, Dickey & Pierce, P.L.C.

(57) ABSTRACT

A phase locked loop (PLL) includes a phase detector configured to receive a reference signal and a feedback signal, wherein the reference signal has a reference frequency, sample the feedback signal, and output a phase detection signal indicative of a phase of the feedback signal. A voltage controlled oscillator is configured to generate an output signal based on the phase detection signal. The output signal has an output frequency greater than the reference frequency. Feedback circuitry is configured to detect a signal edge of the output signal and selectively supply, once per cycle of the reference signal, the detected signal edge of the output signal as the feedback signal.

20 Claims, 4 Drawing Sheets

(56) References Cited

U.S. PATENT DOCUMENTS

| | | | |
|---|---|---|---|
| 9,565,015 B1* | 2/2017 | Tsunoda | H04L 7/0083 |
| 9,608,644 B1* | 3/2017 | Raj | H03L 7/091 |
| 9,634,678 B1* | 4/2017 | Caffee | H03L 7/187 |
| 10,015,005 B2* | 7/2018 | Shibasaki | H03L 7/0807 |
| 10,148,275 B1* | 12/2018 | Pi | H03L 7/104 |
| 10,277,387 B2* | 4/2019 | Tsunoda | H04L 7/0331 |
| 10,320,400 B2* | 6/2019 | Yoo | H03L 7/0891 |
| 10,425,086 B1* | 9/2019 | Chen | H03B 5/04 |
| 10,567,154 B1* | 2/2020 | Wentzloff | H03L 7/0995 |
| 10,615,803 B2* | 4/2020 | Nagam | H03K 3/0322 |
| 10,931,287 B1* | 2/2021 | Takai | G11C 7/222 |
| 10,979,059 B1* | 4/2021 | Shalmani | H03L 7/091 |
| 11,437,980 B2* | 9/2022 | Galton | H03L 7/197 |
| 11,588,489 B1* | 2/2023 | Gupta | H03L 7/0992 |
| 11,652,489 B1* | 5/2023 | Fortier | H03L 7/085 327/156 |
| 11,658,667 B2* | 5/2023 | J | H03L 7/1976 331/23 |
| 11,936,390 B2* | 3/2024 | Gao | H03L 7/1974 |
| 11,962,311 B2* | 4/2024 | Kim | H03L 7/099 |
| 12,028,082 B2* | 7/2024 | Lee | H03L 7/087 |
| 2005/0206458 A1 | 9/2005 | Wu | H03L 7/093 331/1 A |
| 2007/0177703 A1* | 8/2007 | Senba | H04L 7/033 375/376 |
| 2008/0129388 A1* | 6/2008 | Gonzalez | H03L 7/18 331/10 |
| 2008/0231324 A1* | 9/2008 | Liu | H03L 7/0896 327/12 |
| 2008/0317188 A1* | 12/2008 | Staszewski | H03L 7/0991 375/376 |
| 2010/0019855 A1* | 1/2010 | Barrow | H03L 7/183 331/1 A |
| 2011/0050301 A1* | 3/2011 | Perrott | H03L 7/0802 327/156 |
| 2013/0147531 A1* | 6/2013 | Lee | H03L 7/085 327/158 |
| 2013/0251084 A1* | 9/2013 | Werner | H04L 7/033 375/375 |
| 2013/0300469 A1* | 11/2013 | Kelkar | H03L 7/093 327/159 |
| 2013/0321190 A1* | 12/2013 | Lesso | H03M 1/186 341/158 |
| 2014/0340132 A1* | 11/2014 | Terrovitis | H03L 7/0814 327/157 |
| 2015/0222275 A1* | 8/2015 | Reichelt | H03L 7/099 327/156 |
| 2016/0373120 A1* | 12/2016 | Caffee | H03L 7/0891 |
| 2017/0063382 A1* | 3/2017 | Srivastava | H03L 7/23 |
| 2017/0244545 A1* | 8/2017 | Tsunoda | H03L 7/087 |
| 2018/0019864 A1* | 1/2018 | Tsunoda | H04L 7/0331 |
| 2018/0054296 A1* | 2/2018 | Shibasaki | H04L 7/033 |
| 2018/0316359 A1* | 11/2018 | Yoo | H03L 7/087 |
| 2019/0052278 A1* | 2/2019 | Pandita | H03L 7/18 |
| 2019/0115908 A1* | 4/2019 | Prasad | H03K 5/26 |
| 2019/0348989 A1* | 11/2019 | Janardhanan | G04F 10/005 |
| 2020/0004990 A1* | 1/2020 | Kurd | G06F 21/70 |
| 2020/0028515 A1* | 1/2020 | Nagam | H03L 7/091 |
| 2020/0076439 A1* | 3/2020 | Weeks | H03L 7/0805 |
| 2020/0127647 A1* | 4/2020 | Li | H03L 7/095 |
| 2020/0192301 A1* | 6/2020 | Khoury | H03L 7/085 |
| 2021/0075431 A1* | 3/2021 | Wei | H03L 7/091 |
| 2021/0184686 A1* | 6/2021 | Grout | H03L 7/0895 |
| 2021/0376841 A1* | 12/2021 | Okada | H03B 5/02 |
| 2021/0376844 A1* | 12/2021 | Wang | H03M 1/1265 |
| 2022/0052697 A1* | 2/2022 | Farian | H03L 7/089 |
| 2022/0182063 A1* | 6/2022 | Gupta | H03L 7/0898 |
| 2022/0224348 A1* | 7/2022 | Perrott | H03L 7/093 |
| 2023/0093490 A1* | 3/2023 | Sharkia | H03K 5/14 327/117 |
| 2023/0122691 A1* | 4/2023 | Kim | H03L 7/099 327/156 |
| 2023/0308104 A1* | 9/2023 | Nelson | G06F 1/10 |
| 2024/0030927 A1* | 1/2024 | Belz | H03L 7/091 |
| 2024/0072821 A1* | 2/2024 | Perrott | H03K 19/018564 |
| 2024/0187005 A1* | 6/2024 | Khoury | H03L 7/081 |

* cited by examiner

SUB-SAMPLING PHASE LOCKED LOOP (SSPLL) WITH SATURATED REFERENCE FEEDBACK

CROSS-REFERENCE TO RELATED APPLICATION

This application claims the benefit of U.S. Provisional Application No. 63/391,592, filed on Jul. 22, 2022. The entire disclosure of the above application is incorporated herein by reference.

FIELD

The present disclosure relates to phase locked loops (PLLs), and more particularly to improving reference frequency signal stability and noise performance in a sub-sampling phase locked loop (SSPLL).

BACKGROUND

Various devices and circuits may include a phase locked loop (PLL). Devices that implement PLLs include, but are not limited to, communication equipment such as mobile phones, vehicle radar devices, sensors, analog-to-digital converters, digital-to-analog converters, and other clock-related circuits. PLLs may be used to generate an output signal having a phase or frequency based on an input signal. For example, an output of a PLL may have a phase or frequency that tracks a phrase or frequency of the input signal or that has a frequency that is a multiple of the frequency of the input signal.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A phase locked loop (PLL) includes a phase detector configured to receive a reference signal and a feedback signal, wherein the reference signal has a reference frequency, sample the feedback signal, and output a phase detection signal indicative of a phase of the feedback signal. A voltage controlled oscillator is configured to generate an output signal based on the phase detection signal. The output signal has an output frequency greater than the reference frequency. Feedback circuitry is configured to detect a signal edge of the output signal and selectively supply, once per cycle of the reference signal, the detected signal edge of the output signal as the feedback signal.

In other features, the PLL is a sub-sampling PLL (SSPLL). The feedback circuitry includes a multiplexer configured to selectively supply the detected signal edge of the output signal in accordance with a selection signal. The multiplexer is configured to supply, in accordance with the selection signal, a supply voltage as the feedback signal when not supplying the detected signal edge. The feedback circuitry includes a selection control module configured to detect the signal edge of the output signal and generate the selection signal based on the detected signal edge.

In other features, the selection control module is configured to control a pulse of the selection signal to coincide with the detected signal edge. The selection control module controls the pulse of the selection signal to occur only once per cycle of the reference signal. The selection control module includes an averaging circuit configured to obtain an average voltage of the output signal in a pulse window determined by the selection control module. The selection control module is configured to detect the signal edge of the output signal based on the average voltage of the output signal in the pulse window.

In other features, the selection control module is configured to detect the signal edge of the output signal based on a determination of whether the average voltage of the output signal is within a predetermined range of a target voltage. The target voltage is a common mode voltage of the output signal. The signal edge is a rising edge or a falling edge of the output signal. The PLL further includes a charge pump configured to receive phase detection signal and convert the phase detection signal to a control signal. The PLL further includes a loop filter configured to output an average of the control signal.

A sub-sampling phase locked loop (SSPLL) includes a phase detector configured to receive a reference signal and a feedback signal, wherein the reference signal has a reference frequency, sample the feedback signal, and output a phase detection signal indicative of a phase of the feedback signal. A voltage controlled oscillator is configured to generate an output signal based on the phase detection signal. The output signal has an output frequency greater than the reference frequency. A selection control module is configured to detect a signal edge of the output signal and generate a selection signal based on the detected signal edge. A multiplexer is configured to selectively supply as the feedback signal, based on the selection signal, in a first portion of a cycle of the reference signal, the output signal of the voltage controlled oscillator, and, in a second portion of the cycle of the reference signal, a supply voltage.

In other features, the selection control module is configured to control a pulse of the selection signal to coincide with the detected signal edge. The selection control module controls the pulse of the selection signal to occur only once per cycle of the reference signal. The selection control module includes an averaging circuit configured to obtain an average voltage of the output signal in a pulse window determined by the selection control module, and wherein the selection control module is configured to detect the signal edge of the output signal based on the average voltage of the output signal in the pulse window. The selection control module is configured to detect the signal edge of the output signal based on a determination of whether the average voltage of the output signal is within a predetermined range of a target voltage. The target voltage is a common mode voltage of the output signal. The signal edge is a rising edge or a falling edge of the output signal.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A phase locked loop (PLL) typically includes a phase detector (PD), a charge pump (CP), and a loop filter (LF). In some examples, the PLL may include a voltage controlled oscillator (VCO) that oscillates at a frequency based on a reference signal input (i.e., a reference frequency of the reference signal input). A feedback path of the PLL may include a frequency divider. The frequency divider divides a frequency of an output signal (i.e., an output of the VCO) of the PLL (e.g., by an integer N). Typically, the PD and the CP are sources of noise in the PLL. Dividing the frequency of the output signal increases the noise contributed by the PD and the CP. For example, the noise contributed by the PD and the CP may be multiplied by $N^2$.

A sub-sampling PLL (SSPLL) may omit the frequency divider from the feedback path. Instead, the PD is configured to sub-sample the output of the VCO in accordance with the reference signal input. For example, the PD is configured to sub-sample the output of the VCO in accordance with the division ratio N. In this manner, the in band phase noise overall noise of the SSPLL is reduced relative to a conventional PLL. The SSPLL also produces a large phase detection gain to further improve the noise performance.

Since the output of the VCO is a periodic sinusoidal signal, phase error information detected by the PD is also periodic. Accordingly, the PD may lock to integer multiples of the reference frequency. Typically, to correct frequency errors, an SSPLL implements an additional lock mechanism. For example, an SSPLL may include a secondary frequency locked loop that is enabled when the loop drifts out of frequency lock.

An SSPLL according to the present disclosure is configured to improve frequency lock robustness and further improve noise performance. For example, the SSPLL includes a multiplexer (e.g., a multiplexing buffer) in the feedback path. The multiplexer is configured to select between the output of the VCO and a supply voltage (e.g., a saturated DC supply voltage). In one example, a selection control module implements selection logic to sample the output of the VCO. The selection control module detects signal edges (e.g., rising and/or falling edges) of the VCO output and controls the multiplexer such that one sample period of the VCO output (e.g., a rising edge) is passed to the PD for each reference cycle. Accordingly, the VCO output is not provided directly to the PD and a secondary frequency locked loop is not required to obtain frequency lock.

In some examples, the SSPLL includes an adaptive charge pump pulse control circuit to facilitate fast frequency locking and to reduce noise when frequency lock is obtained. The SSPLL may include calibration circuitry configured to perform a calibration process to compensate for variations in a delay of the selection logic. When the calibration process is complete, the calibration circuitry may be powered down to reduce power consumption.

Figure 1A:
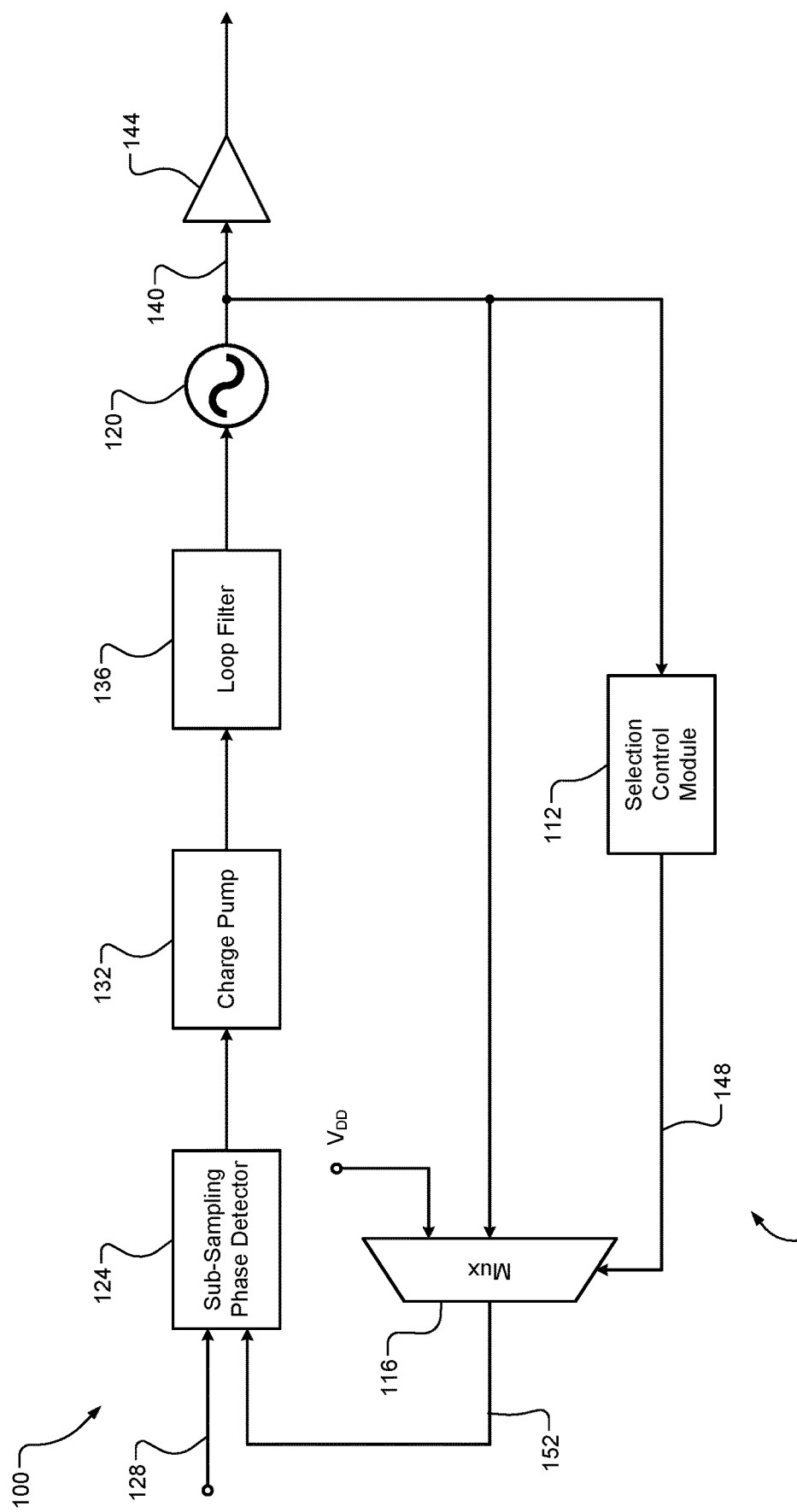
FIG. 1A is a functional block diagram of a sub-sampling phase locked loop (SSPLL) according to the present disclosure.
Figure 1B:
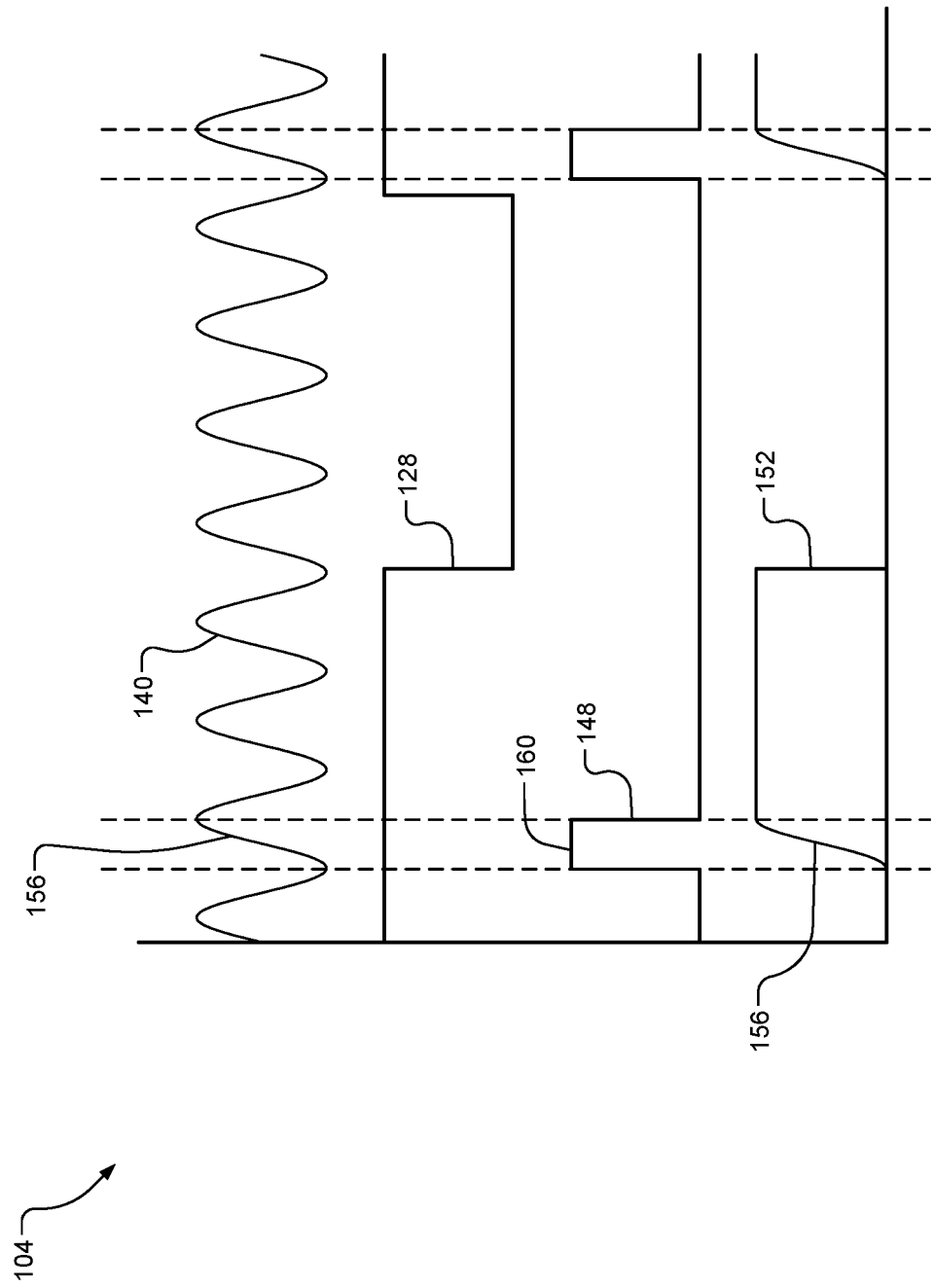
FIG. 1B is a timing diagram of the SSPLL of FIG. 1A.

FIGS. 1A and 1B show an example PLL (e.g., an SSPLL) 100 and a timing diagram 104 according to the present disclosure. A feedback path of the PLL 100 includes feedback circuitry 108 configured to implement principles of the present disclosure. For example, the feedback circuitry includes a selection control module 112 and a multiplexer 116 (e.g., a multiplexing buffer). The multiplexer 116, responsive to the selection control module 112, is configured to select between an output of a VCO 120 and a supply voltage (e.g., a saturated DC supply voltage $V_{DD}$) as described below in more detail.

A sub-sampling phase detector (SSPD) 124 receives an output of the multiplexer (a feedback signal) and a reference signal 128 having a reference frequency. The SSPD 124 is configured to sub-sample the feedback path in accordance with the reference signal 128. For example, the SSPD 124 is configured to sub-sample the feedback signal at the reference frequency, which is N times slower than the VCO frequency. The SSPD 124 generates an output signal indicative of a comparison between the feedback signal and the reference signal 128 (e.g., a phase error or phase detection signal indicative of a phase difference between the feedback signal and the reference signal 128).

A charge pump 132 is configured to receive the phase detection signal and convert the phase detection signal from a voltage signal into a current that drives the loop filter, generating a control current signal (i.e., to control the VCO 120). The charge pump 132 supplies the control current signal to a loop filter 136. The loop filter 136 may be implemented as a passive filter (e.g., an RC filter) configured to output an average of the control voltage signal, which in turn corresponds to the phase detection signal generated by the SSPD 124. The VCO 120 is configured to generate an output signal 140 having an output frequency based on the output of the loop filter 136. In some examples, the output signal 140 is passed through a buffer 144.

The selection control module 112 is configured to detect rising and falling edges of the output signal 140. The selection control module 112 outputs a selection signal 148 to control the multiplexer 116 such that one sample period of the output signal 140 (e.g., a rising edge) is passed or supplied from the multiplexer 116 to the SSPD 124 for each reference cycle (i.e., each cycle of the reference signal 128).

Referring now to FIG. 1B and with continued reference to FIG. 1A, the timing diagram 104 illustrates operation of the output signal 140, the reference signal 128, the selection signal 148, and a feedback signal 152 (i.e., the output of the multiplexer 116). Typically, the output of the VCO 120 (i.e., the output signal 140) is a periodic sinusoidal signal. In the PLL 100 of FIG. 1A, the reference signal 128 is a square wave having a reference frequency that is less than the frequency of the output signal 140. Accordingly, multiple cycles of the output signal 140 occur for a single cycle of the reference signal 128. For example, as shown, multiple pulses (e.g., four, as shown, or more) occur for each pulse of the reference signal 128.

In the PLL 100 of the present disclosure, the output signal 140 is not supplied directly to the SSPD 124. Instead, the selection control module 112 is configured to detect rising and falling edges of the output signal 140 to identify and pass a single rising edge 156 of the output signal 140 to the SSPD 124 per cycle of the reference signal 128. For example, the selection control module 112 controls a pulse 160 of the selection signal 148 to coincide with the rising edge 156 of the output signal 140 such that the rising edge 156 is output as the feedback signal 152. The selection signal 148 is calibrated to align a start time and duration of the pulse 160 to coincide with the rising edge 156 as described below in more detail. Although described with respect to the rising edge 156, in other examples the selection signal 148 may be timed in accordance with a falling edge of the output signal 140.

In a remaining portion of the corresponding cycle of the reference signal 128, the selection control module 112 controls the selection signal 148 such that the multiplexer 116 passes the supply voltage to the SSPD 124. Accordingly, the feedback signal 152 sampled by the SSPD 124 will have the same frequency as the reference signal 128 when in a locked state and will include only a single rising edge per cycle.

The above-described operation of the selection control module 112 results in a hybrid type of phase detection that includes aspects of both a bang-bang phase detector (BBPD) and an SSPD. When the PLL 100 is initially unlocked, the SSPD 124 is likely to sample a saturated region of the feedback signal 152 (i.e., a region of the feedback signal 152 where the saturated supply voltage is passed by the multiplexer 116), which is similar to the binary decision operation of a BBPD.

To ensure frequency lock, a gain of the charge pump 132 is increased by increasing the duration of a current pulse supplied by the SSPD 124 when the SSPD 124 determines that the sample was taken from the saturated region. Once frequency corrections are made and samples are taken along the rising edge of the feedback signal 152, the gain can be reduced (e.g., by decreasing the duration of the current pulse) to ensure stability and reduce noise of the PLL 100. In some examples, to adjust the gain of the charge pump 132, the charge pump 132 is implemented as an adaptive charge pump pulse control circuit to facilitate fast locking after frequency variation and to reduce noise when frequency lock is obtained. The charge pump 132 may implement two charge pump circuit paths and only one of the circuit paths is activated in each cycle of the reference signal 128. For example, a first charge pump circuit path is active in a fast lock mode and a second charge pump circuit path is active when the PLL 100 is in a nominal sub-sampling lock condition (i.e., after lock is obtained in the fast lock mode).

Figure 1C:
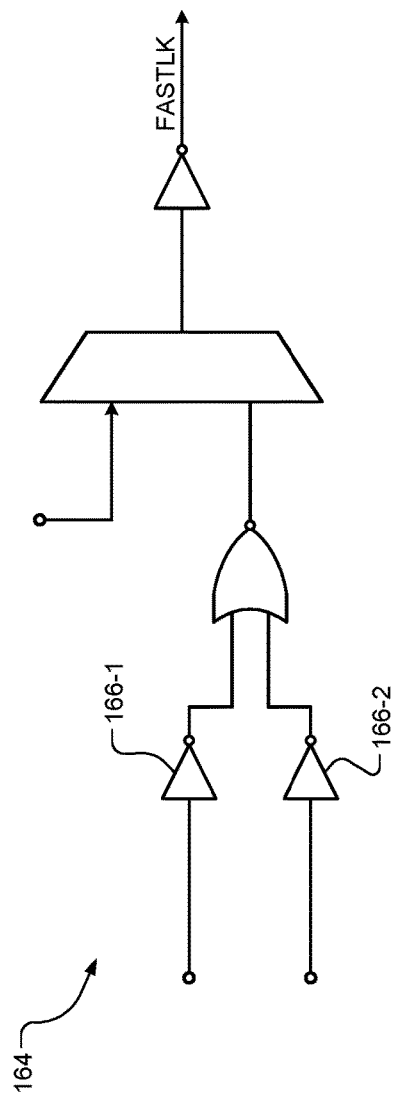
FIG. 1C is an example fast lock control logic circuit according to the present disclosure.
Figure 1D:
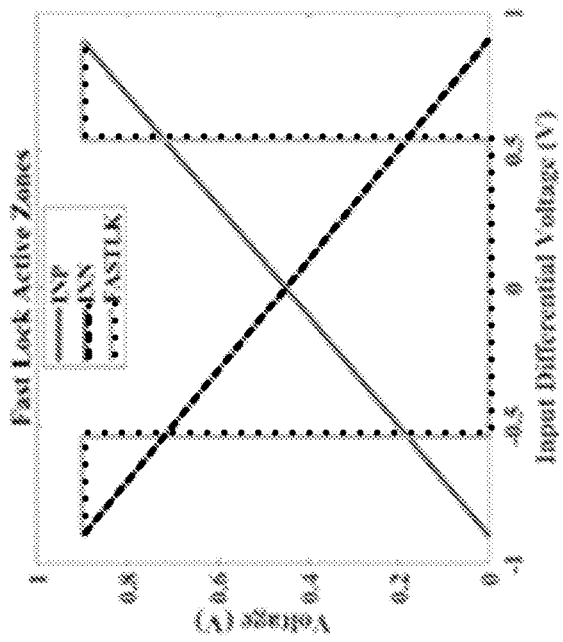
FIG. 1D illustrates a timing diagram of the fast lock control logic circuit.

An example fast lock control logic circuit 164 is shown in FIG. 1C. For example, the SSPD 124 includes the control logic circuit 164. The control logic circuit 164 is configured to detect whether the SSPD 124 is sampling in the saturated region. Inverters 166-1 and 166-2 (collectively, inverters 166) receive differential samples of the feedback signal 152 as sampled by the SSPD 124 (corresponding to INP and INN in FIG. 1D, respectively). When the feedback signal 152 is in a non-linear region (e.g., when an input differential voltage of INP and INN is not within a predetermined range, such as −0.5 V to 0.5 V as shown), an output of the control logic circuit 164 (a FASTLK signal) is high, which activates the fast lock mode. Conversely, when the feedback signal 152 is in a linear region (e.g., when the input differential voltage of INP and INN is within the predetermined range), an output of the control logic circuit 164 is low, which disables the fast lock mode.

Figure 2:
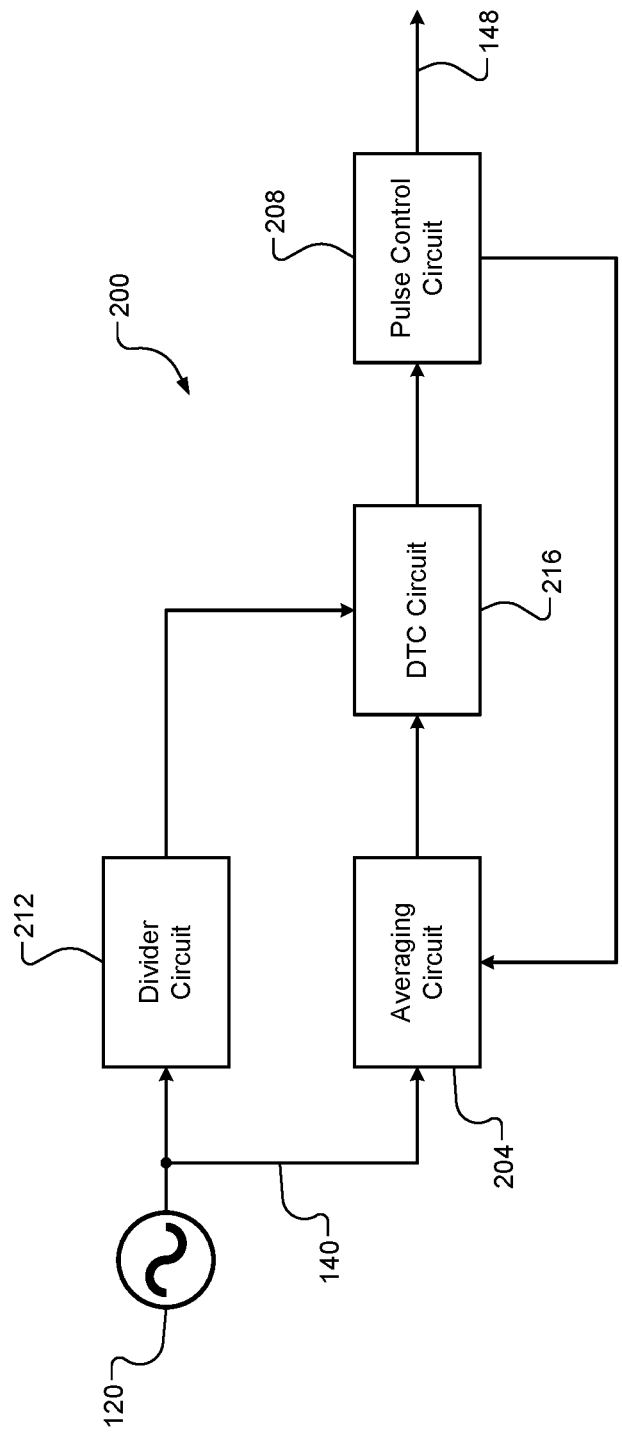
FIG. 2; is a functional block diagram of an example selection control module according to the present disclosure.

FIG. 2 shows one example of a selection control module 200 according to the present disclosure. The selection module 200 is configured to detect rising and/or falling edges of an output of a VCO (e.g., the output signal 140), align timing and duration of a pulse of the selection signal 148 to a rising edge, and control the multiplexer 116 to pass one rising edge of the output signal 140 per cycle of the reference signal 128.

The selection control module 200 includes an averaging circuit 204 and a pulse control circuit 208. The averaging circuit 204 receives the output signal 140 and determines an average value of the output of the VCO 120 in a windowed time period (i.e., a pulse window corresponding to a timing and duration of the pulse 160). For example, the averaging circuit 204 includes a switched low pass filter circuit configured to average the output signal 140 over the pulse window as set by the pulse control circuit 208. An output of the averaging circuit 204 indicates whether the average voltage of the output signal 140 in the pulse window corresponds to a beginning of the rising edge.

In an example implementation, the averaging circuit 204 indicates when the average voltage corresponds to a common mode voltage of the output of the VCO 120. For example, the averaging circuit 204 determines when the average voltage of the output signal 140 is between first and second reference thresholds that are selected based on a target voltage (e.g., the common mode voltage). The output of the averaging circuit 204 indicates whether the average voltage in the pulse window is between the first and second reference thresholds (i.e., within a predetermined range of the target voltage). If the average voltage is between the first and second reference thresholds, then the pulse window (and the pulse 160) is aligned with the rising edge 156 of the output signal 140. Conversely, if the average voltage is outside of the first and second reference thresholds, then the pulse window of the pulse 160 output by the pulse control circuit 208 is adjusted (e.g., forward or backward) accordingly. In this manner, the pulse control module 200 is configured to adjust the selection signal 148 until the average voltage of the output signal 140 during the pulse window corresponds to a target voltage indicative of the rising edge 156.

The pulse control module 200 may include a divider circuit 212 and a digital-to-time conversion (DTC) circuit 216. The divider circuit 212 divides/scales down the output of the VCO 120. Accordingly, an output of the divider circuit 212 is a divided signal corresponding to the output signal 140. The DTC circuit 216 receives the divided signal and the output of the averaging circuit 204. The DTC circuit 216 is configured to align the pulse window with the rising (or falling, in embodiments) edge of the output signal 140. For example, the DTC circuit 216 either maintains or changes (i.e., increases or decreases) a delay of the divided signal based on the output of the averaging circuit 204. The output of the DTC circuit 216 corresponds to the divided signal that is adjusted (e.g., phase shifted) in accordance with the output of the averaging circuit 204.

As one example, the DTC circuit 216 implements a counter that increases when the output of the averaging circuit indicates that the average voltage is not within the targeted voltage range (i.e., between the first and second reference thresholds). As the counter increases, a delay applied by the DTC circuit 216 increases. When the average voltage is within the targeted voltage range, the counter no longer increases. In this manner, the DTC circuit 216 is configured to increase the delay until the pulse window corresponds to the rising edge 156. The pulse control circuit 208 outputs the selection signal 148 with the pulse 160 having a timing based on the output of the DTC circuit 216.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects.

The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:
1. A phase locked loop (PLL), comprising:
a phase detector configured to receive a reference signal and a feedback signal, wherein the reference signal has a reference frequency,
sample the feedback signal, and
output a phase detection signal indicative of a phase of the feedback signal;
a voltage controlled oscillator configured to generate an output signal based on the phase detection signal, wherein the output signal has an output frequency greater than the reference frequency; and
feedback circuitry configured to
detect a signal edge of the output signal, and
selectively supply, once per cycle of the reference signal, the detected signal edge of the output signal as the feedback signal.

2. The PLL of claim 1, wherein the PLL is a sub-sampling PLL (SSPLL).

3. The PLL of claim 1, wherein the feedback circuitry includes a multiplexer configured to selectively supply the detected signal edge of the output signal in accordance with a selection signal.

4. The PLL of claim 3, wherein the multiplexer is configured to supply, in accordance with the selection signal, a supply voltage as the feedback signal when not supplying the detected signal edge.

5. The PLL of claim 3, wherein the feedback circuitry includes a selection control module configured to detect the signal edge of the output signal and generate the selection signal based on the detected signal edge.

6. The PLL of claim 5, wherein the selection control module is configured to control a pulse of the selection signal to coincide with the detected signal edge.

7. The PLL of claim 6, wherein the selection control module controls the pulse of the selection signal to occur only once per cycle of the reference signal.

8. The PLL of claim 6, wherein the selection control module includes an averaging circuit configured to obtain an average voltage of the output signal in a pulse window determined by the selection control module, and wherein the selection control module is configured to detect the signal edge of the output signal based on the average voltage of the output signal in the pulse window.

9. The PLL of claim 8, wherein the selection control module is configured to detect the signal edge of the output signal based on a determination of whether the average voltage of the output signal is within a predetermined range of a target voltage.

10. The PLL of claim 9, wherein the target voltage is a common mode voltage of the output signal.

11. The PLL of claim 1, wherein the signal edge is a rising edge or a falling edge of the output signal.

12. The PLL of claim 1, further comprising a charge pump configured to receive phase detection signal and convert the phase detection signal to a control signal.

13. The PLL of claim 12, further comprising a loop filter configured to output an average of the control signal.

14. A sub-sampling phase locked loop (SSPLL), comprising:
a phase detector configured to
receive a reference signal and a feedback signal, wherein the reference signal has a reference frequency,
sample the feedback signal, and
output a phase detection signal indicative of a phase of the feedback signal;
a voltage controlled oscillator configured to generate an output signal based on the phase detection signal, wherein the output signal has an output frequency greater than the reference frequency;
a selection control module configured to detect a signal edge of the output signal and generate a selection signal based on the detected signal edge; and
a multiplexer configured to selectively supply as the feedback signal, based on the selection signal,
in a first portion of a cycle of the reference signal, the output signal of the voltage controlled oscillator, and
in a second portion of the cycle of the reference signal, a supply voltage.

15. The SSPLL of claim 14, wherein the selection control module is configured to control a pulse of the selection signal to coincide with the detected signal edge.

16. The SSPLL of claim 15, wherein the selection control module controls the pulse of the selection signal to occur only once per cycle of the reference signal.

17. The SSPLL of claim 15, wherein the selection control module includes an averaging circuit configured to obtain an average voltage of the output signal in a pulse window determined by the selection control module, and wherein the selection control module is configured to detect the signal edge of the output signal based on the average voltage of the output signal in the pulse window.

18. The SSPLL of claim 17, wherein the selection control module is configured to detect the signal edge of the output signal based on a determination of whether the average voltage of the output signal is within a predetermined range of a target voltage.

19. The SSPLL of claim 18, wherein the target voltage is a common mode voltage of the output signal.

20. The SSPLL of claim 14, wherein the signal edge is a rising edge or a falling edge of the output signal.

* * * * *